(12) United States Patent
Guan et al.

(10) Patent No.: US 9,978,740 B2
(45) Date of Patent: May 22, 2018

(54) UNI-DIRECTIONAL TRANSIENT VOLTAGE SUPPRESSOR (TVS)

(71) Applicant: Alpha and Omega Semiconductor Incorporated, Sunnyvale, CA (US)

(72) Inventors: Lingpeng Guan, Sunnyvale, CA (US); Madhur Bobde, San Jose, CA (US); Anup Bhalla, Princeton Junction, NJ (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days. days.

(21) Appl. No.: 15/185,814

(22) Filed: Jun. 17, 2016

(65) Prior Publication Data

US 2016/0300833 A1   Oct. 13, 2016

Related U.S. Application Data

(60) Division of application No. 14/263,711, filed on Apr. 28, 2014, now Pat. No. 9,391,061, which is a continuation of application No. 13/171,037, filed on Jun. 28, 2011, now Pat. No. 8,710,627.

(51) Int. Cl.
*H01L 27/02* (2006.01)
*H01L 27/08* (2006.01)
*H01L 27/082* (2006.01)
*H01L 21/8222* (2006.01)

(52) U.S. Cl.
CPC ...... *H01L 27/0262* (2013.01); *H01L 21/8222* (2013.01); *H01L 27/0255* (2013.01); *H01L 27/0259* (2013.01); *H01L 27/082* (2013.01); *H01L 27/0814* (2013.01)

(58) Field of Classification Search
CPC .............. H01L 27/0259; H01L 27/082; H01L 27/0823; H01L 21/8222; H01L 27/0255; H01L 27/0814; H01L 23/62; H01L 27/0248–27/0296
See application file for complete search history.

(56) References Cited

U.S. PATENT DOCUMENTS

| | | | |
|---|---|---|---|
| 5,293,057 A | 3/1994 | Ho et al. | |
| 6,172,403 B1 | 1/2001 | Chen | |
| 7,557,554 B2 | 3/2009 | Chang | |
| 7,538,997 B2 | 5/2009 | Mallikararjunaswamy | |

(Continued)

FOREIGN PATENT DOCUMENTS

| | | |
|---|---|---|
| WO | 2008066903 A | 6/2008 |
| WO | 2009042419 A | 4/2009 |

OTHER PUBLICATIONS

Final Office Action for U.S. Appl. No. 13/171,037, dated Aug. 6, 2013.

(Continued)

*Primary Examiner* — Kevin Parendo
(74) *Attorney, Agent, or Firm* — JDI Patent; Joshua D. Isenberg

(57) ABSTRACT

A unidirectional transient voltage suppressor (TVS) device is formed with first and second NPN transistors that are connected in parallel to each other. Each NPN transistor includes a collector region, an emitter. The first and second NPN structures are formed on a common substrate. The first NPN transistor has a floating base and the second NPN transistor has a base shorted to an emitter.

15 Claims, 10 Drawing Sheets

(56) References Cited

U.S. PATENT DOCUMENTS

| | | |
|---|---|---|
| 7,554,839 B2 | 6/2009 | Bobde |
| 7,781,826 B2 | 8/2010 | Mallikararjunaswamy et al. |
| 7,880,223 B2 | 2/2011 | Bobde |
| 7,893,778 B2 | 2/2011 | Mohtashemi |
| 7,977,930 B2 | 7/2011 | Chang |
| 8,710,627 B2 | 4/2014 | Guan et al. |
| 8,729,881 B2 | 5/2014 | Chang |
| 2001/0043449 A1 | 11/2001 | Okushima |
| 2003/0218223 A1* | 11/2003 | Nishiyama ........ H01L 21/26586 257/410 |
| 2004/0114288 A1 | 6/2004 | Tao et al. |
| 2006/0267134 A1* | 11/2006 | Tilke .................... H01L 27/105 257/519 |
| 2008/0121988 A1 | 5/2008 | Mallikararjunaswamy et al. |
| 2008/0218922 A1 | 9/2008 | Mallikararjunaswamy et al. |
| 2009/0045457 A1 | 2/2009 | Bobde |
| 2009/0057869 A1 | 3/2009 | Hebert et al. |
| 2009/0115018 A1 | 5/2009 | Mallikarjunaswamy |
| 2009/0261897 A1 | 10/2009 | Bobde |
| 2009/0268361 A1 | 10/2009 | Mallikarjunaswamy |
| 2010/0044750 A1 | 2/2010 | Imahashi |
| 2010/0123985 A1 | 5/2010 | Wang et al. |
| 2010/0244151 A1* | 9/2010 | French .............. H01L 21/26513 257/408 |
| 2010/0276779 A1 | 11/2010 | Guan et al. |
| 2010/0314716 A1 | 12/2010 | Mallikararjunaswamy et al. |
| 2010/0321840 A1 | 12/2010 | Bobde |
| 2011/0089542 A1 | 4/2011 | Shau |
| 2011/0095833 A1 | 4/2011 | Mohtashemi et al. |
| 2011/0127577 A1 | 6/2011 | Bobde |
| 2012/0086499 A1 | 4/2012 | Husain et al. |

OTHER PUBLICATIONS

Non-Final Office Action for U.S. Appl. No. 13/171,037, dated Apr. 15, 2013.

Non-Final Office Action for U.S. Appl. No. 14/263,711, dated Sep. 3, 2015.

* cited by examiner

UNI-DIRECTIONAL TRANSIENT VOLTAGE SUPPRESSOR (TVS)

CLAIM OF PRIORITY

This Application is a division of co-pending U.S. patent application Ser. No. 14/263,711, to Lingpeng Guan, Madhur Bobde, and Anup Bhalla filed Apr. 28, 2014 and entitled "UNI-DIRECTIONAL TRANSIENT VOLTAGE SUPPRESSOR (TVS)", the entire contents of which are incorporated herein by reference.

Application Ser. No. 14/263,711 is a continuation of co-pending U.S. patent application Ser. No. 13/171,037, to Lingpeng Guan, Madhur Bobde, and Anup Bhalla filed Jun. 28, 2011 and entitled "UNI-DIRECTIONAL TRANSIENT VOLTAGE SUPPRESSOR (TVS)", the entire contents of which are incorporated herein by reference.

FIELD OF INVENTION

This invention relates to transient voltage suppression more specifically to a uni-directional transient voltage suppressor (TVS) device and method of manufacture of such a device.

BACKGROUND OF INVENTION

Transient voltage suppressors (TVS) are devices used to protect integrated circuits from damage caused by over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to provide protection to circumvent the damages that are likely to occur to the integrated circuits when such over voltage conditions occur. As an increasing number of devices are implemented with integrated circuits that are vulnerable to over voltage damages, demands for TVS protection are also increased. Exemplary applications of TVS can be found in USB power and data line protection, digital video interfaces, high speed Ethernet, Notebook computers, monitors and flat panel displays.

Unidirectional TVS devices are widely used for protecting the integrated circuits of applications described above. Such devices are defined by their operation. During a transient's positive cycle (i.e., positive voltage spike) a unidirectional TVS device is reverse biased. The device operates in avalanche mode and directs the transient current to the ground. The transient is also clamped at the clamping level provided by the TVS device, thereby ensuring protection to the attached integrated circuit. During a transient's negative cycle (i.e., negative voltage spike) the unidirectional TVS device is forward biased. The transient is clamped at the built-in voltage drop of the unilateral device, and current is conducted in the forward direction.

Conventional unidirectional TVS devices employ an NPN transistor with the base and emitter shorted to provide the functionality of the unidirectional device. These are typically used for applications requiring a clamping voltage below 5 V. However, in order to achieve effective protection for applications below 3.3 V (e.g., 3.3 V, 2.4V, or 1.8V), the base (i.e., p-layer) of the NPN transistor must be very lightly doped. Because the clamping voltage of the unidirectional TVS device is so heavily dependent on the doping concentration of the base layer, any slight variations in the processing/manufacturing steps may greatly affect the performance/behavioral characteristics of the unidirectional device. As such, there is need in the art for a unidirectional TVS device that supports applications that operate below 5 V.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1A:
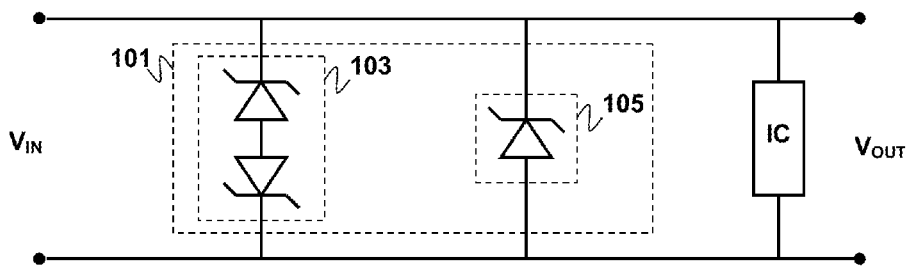
FIG. 1A is a circuit diagram illustrating a unidirectional transient voltage suppressor (TVS) device in accordance with an embodiment of the present invention.

FIG. 1A is a circuit diagram of a unidirectional transient voltage suppressor (TVS) 101 in accordance with an embodiment of the present invention. The unidirectional transient voltage suppressor 101 consists of two separate NPN structures 103, 105 that are connected in parallel. The first NPN structure 103 may be implemented as an NPN transistor with a floating base, which will be discussed in detail below. The second NPN structure 105 may be implemented as an NPN transistor with the base shorted to the emitter, which will also be discussed in detail below. The TVS device 101 may be connected in parallel to an integrated circuit IC. The TVS device 101 is configured to protect such integrated circuits IC from damage from transients (i.e., unwanted high voltage spikes) by directing transient current through the TVS 101 and clamping the voltage across the integrated circuit IC during occurrence of a transient.

Figure 1B:
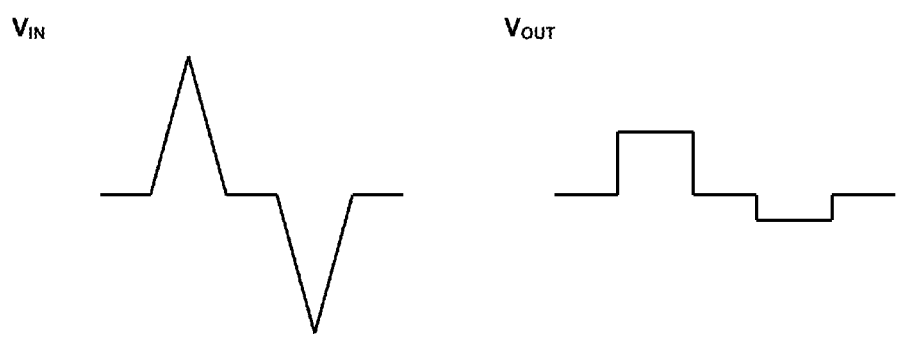
FIG. 1B is a diagram illustrating the behavior of the unidirectional transient voltage suppressor (TVS) device in FIG. 1A.

The TVS 101 is configured such that the first NPN structure 103 is active when $V_{IN}>0$ and the second NPN structure 105 is active when $V_{IN}<0$. The first NPN structure 103 controls the TVS behavior when a positively biased (i.e., $V_{IN}>0$) transient occurs. The second NPN structure 105 controls the TVS behavior when a negatively biased (i.e., $V_{IN}<0$) transient occurs. FIG. 1B are graphs illustrating the behavior of the TVS 101 upon occurrence of a transient. During a transient's positive cycle (i.e., $V_{IN}>0$), the first NPN structure 103 is reverse biased, as well as the second NPN structure 105. The first NPN structure 103, will dominate the unidirectional TVS behavior during a positive transient because it is configured to have a much lower breakdown voltage than the second NPN structure 105. This first NPN structure 103 acts as an avalanche diode during the occurrence of a positive transient, directing the transient current to the ground and clamping the transient voltage at the clamping voltage associated with the first NPN structure 103. During a transient's negative cycle (i.e., $V_{IN}<0$), the second NPN structure 105 is forward biased, while the first NPN structure 103 remains reverse biased. As a result, this second NPN structure 105 conducts transient current in the forward direction while clamping the transient voltage at the built-in forward voltage drop (e.g., 0.7 V) associated with the second NPN structure 105.

Thus, in order to support low voltage applications, the first NPN structure 103 of the TVS device 101 must be configured to achieve a low clamping voltage. The clamping voltage of the first NPN structure 103 is highly dependent on the breakdown voltage of the first NPN structure 103, and so the first NPN structure 103 should be designed to achieve a low breakdown voltage. The second NPN structure 105 is co-packaged with the first NPN structure 103 in order to suit unidirectional application.

Figure 2A:
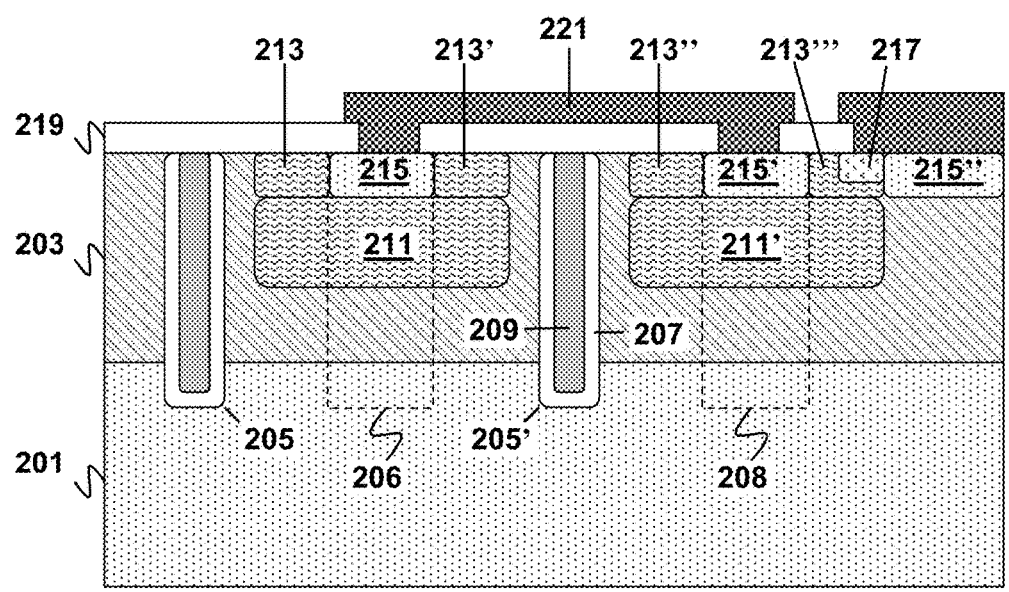
FIG. 2A is a cross-sectional schematic diagram illustrating a unidirectional transient voltage suppressor (TVS) device in accordance with an embodiment of the present invention.

To more clearly illustrate the structure and functionality of the invented unidirectional transient voltage suppressor, please refer to FIG. 2A. FIG. 2A is a cross-sectional schematic diagram illustrating a unidirectional transient voltage suppressor (TVS) device 200 in accordance with an embodiment of the present invention. The TVS 200 in FIG. 2A behaves in accordance with the TVS 101 described above in the circuit diagram of FIG. 1A, while exhibiting desirable clamping voltage characteristics.

The TVS 200 is formed on a heavily doped n+ semiconductor substrate 201 which supports an epitaxial layer 203. An n+ substrate 201 is used in order to simplify the formation of the two NPN structures that collectively form the TVS device 200. The epitaxial layer 203 is a lightly doped n− layer. As used herein, a concentration of dopants less than about $10^{16}/cm^3$ may be regarded as "lightly doped" and a concentration of dopants greater than about $10^{17}/cm^3$ may be regarded as "heavily doped". By way of example, and not by way of limitation, the epitaxial layer 203 may be doped with phosphorous having a concentration on the order of $3\times10^{16}/cm^3$.

For convenience, use of + or − after a designation of charge carrier type (p or n) refers generally to a relative degree of concentration of designated type of charge carriers within a semiconductor material. In general terms an n+ material has a higher negative charge carrier (e.g., electron) concentration than an n material and an n material has a higher carrier concentration than an n− material. Similarly, a p+ material has a higher positive charge carrier (e.g., hole) concentration than a p material and a p material has a higher concentration than a p− material. It is noted that what is relevant is the concentration of charge carriers, not necessarily dopants. For example, a material may be heavily doped with n-type dopants but still have a relatively low charge carrier concentration if the material is also sufficiently counter-doped with p-type dopants.

To facilitate understanding of embodiments of the invention it is useful to define lateral and transverse directions. The substrate 201 and epitaxial layer 203 may be generally planar in shape and, as such, may define a reference plane that generally extends parallel to the substrate and/or epitaxial layer. In the context of the cross-section drawings herein, such a reference plane may extend to the left and right in the drawing sheet and perpendicular to the plane of the drawing. As used herein, the term lateral refers to a direction generally parallel to the reference plane and the term transverse refers to a direction generally perpendicular to the reference plane. For the sake of simplicity, the terms left and right may be substituted for lateral in discussing the drawings and the terms above, below, and the like may be used to indicate the transverse direction.

A pair of isolation trenches (i.e., first isolation trench 205 and second isolation trench 205') may be formed in a transverse direction within the epitaxial layer 203 and the substrate 201 such that the bottom of each isolation trench 205, 205' sits within the substrate 201 below the interface between the substrate 201 and the epitaxial layer 203. Each isolation trench 205, 205' may then be lined with dielectric material (e.g., silicon oxide) 207. Remaining portions of the isolation trenches 205, 205' not filled with dielectric material may then be filled with polysilicon 209. Alternatively, the isolation trenches may be filled with dielectric material (e.g., silicon oxide). Polysilicon is preferred over silicon oxide for filling the trenches because it simplifies the manufacturing process for the TVS device 200. The isolation trenches 205, 205' are configured to isolate the two NPN structures 206, 208 from each other such that unwanted lateral P-N-P behavior does not occur during device operation.

A pair of p-body regions (i.e., first p-body region 211 and second p-body region 211') are formed within the epitaxial layer 203. The first p-body region 211 forms the body of the first NPN structure 206. The second p-body region 211 forms the body of the second NPN structure 208.

A set of p-type doped trigger regions 213, 213', 213", 213''' are formed within a top surface of the epitaxial layer 203. A set of three n+ source regions 215, 215', 215" are also formed within the top surface of the epitaxial layer 203. A first source region 215 is located transversely adjacent the first body region 211 between first and second trigger regions 213, 213' that are laterally adjacent the first source region and transversely adjacent the first body region. A second source region 215' is located transversely adjacent the second body region 211' between third and fourth trigger regions 213", 213''' that are laterally adjacent the second source region 215' and transversely adjacent the second body region 211'. A third source region 215" is located laterally adjacent a fourth trigger region 213'''. The fourth trigger region 213''' is located between the second source region 215' and the third source region 215".

The trigger regions 213, 213', 213", 213''' allow for electrical connections to be made to or to be made from the p-body regions 211, 211'. The first and second n+ source regions 215, 215' form the collector region of the first and second NPN structures, respectively. The function of the third n+ source region 215" will be discussed in detail below.

A p+ implant region 217 is formed within the top surface of the fourth trigger region 213''' laterally adjacent the third source region 215". The p+ implant region 217 may be doped with Boron having a concentration on the order of $1\times10^{18}/cm^3$. The functionality of this p+ implant region will be discussed in detail below.

The first NPN structure 206, which functions to clamp positively biased transient voltages, is formed by the first n+ source region 215, the p-body region 211, the epitaxial region 203, and the n+ substrate 201. The n+ source region 215 forms the collector of the NPN structure, the p-body region 211 forms the base of the first NPN structure 206, and portions of the epitaxial layer 203 and n+ substrate 201 collectively form the emitter of the NPN structure 206.

The clamping voltage of the first NPN structure 206 is heavily dependent on the breakdown voltage of the first NPN structure. The breakdown voltage of an NPN structure is dependent on two different factors: the breakdown voltage of the P-N junction (i.e. junction between p+ body region 211 and n+ source region 215) and the gain of the NPN structure. The breakdown voltage of the NPN structure is directly proportional to the breakdown voltage of the P-N junction and inversely proportional to the gain of the NPN structure. One approach to limiting the breakdown voltage is to increase the doping concentration of the p+ body region 211, effectively lowering the breakdown voltage of the NPN structure. However, there is a certain threshold concentration at which further increase in the doping concentration can lead to a significant reverse leakage current that has the potential to destroy the device. The first NPN structure 206 is able to rectify this issue by implementing a floating base (i.e., no external electrical connections are made directly to the p-body region 211). A floating base NPN structure can be configured to achieve low breakdown voltage with high doping concentration without suffering from significant leakage current. With a floating base NPN transistor, the leakage current flowing across the base-collector junction must also flow across the emitter-base junction. Thus, the leakage is amplified by the gain of the NPN transistor and the floating base NPN transistor has lower breakdown voltage than that of shorted base with emitter NPN transistor.

Additionally, the breakdown voltage of the first NPN structure 206 may be lowered by increasing the gain of the NPN structure. The gain of the NPN structure is dependent on the thickness of the base (i.e., p+ body region 211) and so by decreasing the thickness of the p+ body region 211, the breakdown voltage of the TVS may also be effectively decreased. Thus, the first NPN structure in the unidirectional TVS device 200 may be configured to exhibit a low clamping voltage to protect integrated circuits from positively biased transients.

The second NPN structure 208, which functions to clamp negatively biased transient voltages, is formed by the second source region 215', the second p-body region 211', portions of the epitaxial layer 203, and portions of the n+ substrate 201. The second n+ source region 215' forms the collector of the second NPN structure 208, the second p-body region 211' forms the base of the second NPN structure, and the epitaxial layer 203 and n+ substrate 201 collectively form the emitter of the second NPN structure 208. The third n+ source region 215" and p+ implant region 217 short circuits the base (second p-body region 211') to the emitter (n+ substrate 201 and epitaxial layer 203) so that the second NPN structure 208 may act as a forward-biased diode upon the occurrence of a negatively biased transient.

When a positively biased transient occurs, all current will flow through the first NPN structure 206 rather than the second NPN structure 208. This is because the first NPN structure 206 has a much lower breakdown voltage than the second NPN structure 208. Thus, it will exhibit avalanche breakdown at a lower magnitude transient than the second NPN structure, and as such will dominate the behavior of the TVS during the occurrence positively biased transients.

When a negatively biased transient occurs, all current will flow through the second NPN structure 208 rather than the first NPN structure 206. This is because the second NPN structure 208 will act as a forward biased P-N diode, and as such will dominate the behavior of the TVS during the occurrence of negatively biased transients.

A top-surface insulating layer 219 and metal pads 221 may then be formed on top of the epitaxial layer 203. Several openings may be formed within the top-surface insulating layer 219 to allow metal pads to form electrical contacts/connections to the components of the TVS 200. An opening may be formed above the first source region 215 to allow for a metal pad 221 to make contact with the first NPN structure. Another opening may be formed above the second source region 215' to allow for a metal pad 221 to make contact with the second NPN structure. A third opening may be formed above the p+ implant region 217 and third source region 215" in order to short the base of the second NPN structure 208 to the emitter of the second NPN structure.

Figure 2B:
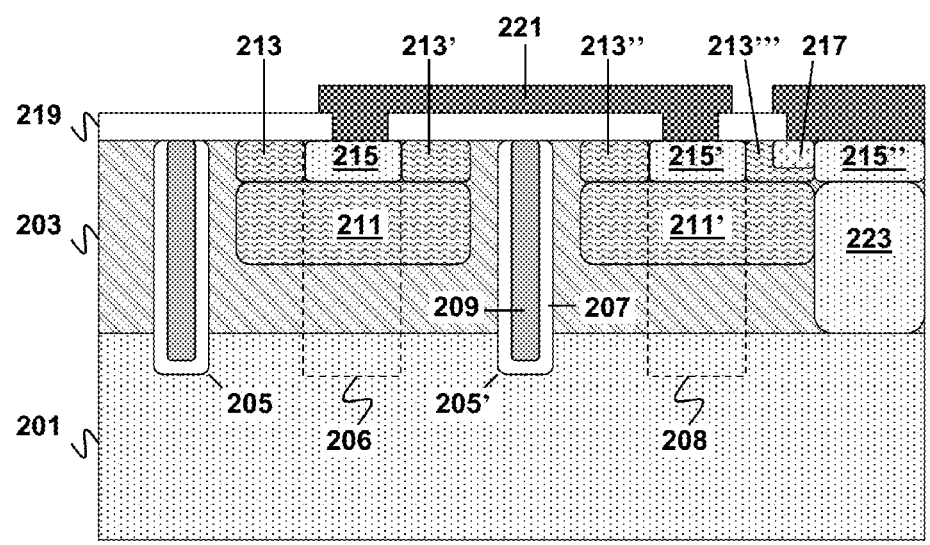
FIG. 2B is a cross-sectional schematic diagram illustrating a unidirectional transient voltage suppressor (TVS) device in accordance with an alternative embodiment of the present invention.
Figure 2C:
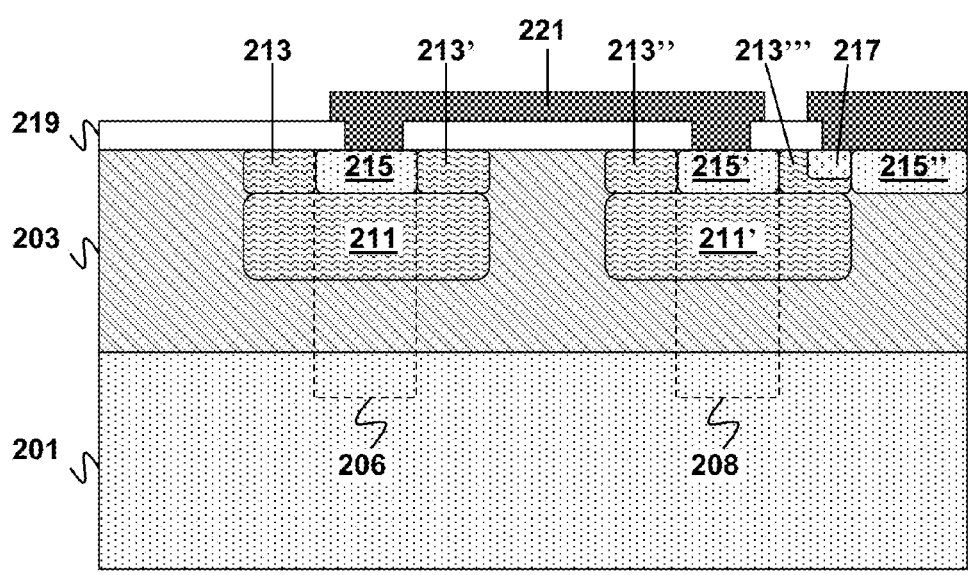
FIG. 2C is a cross-sectional schematic diagram illustrating a unidirectional transient voltage suppressor (TVS) device in accordance with another alternative embodiment of the present invention.
Figure 2D:
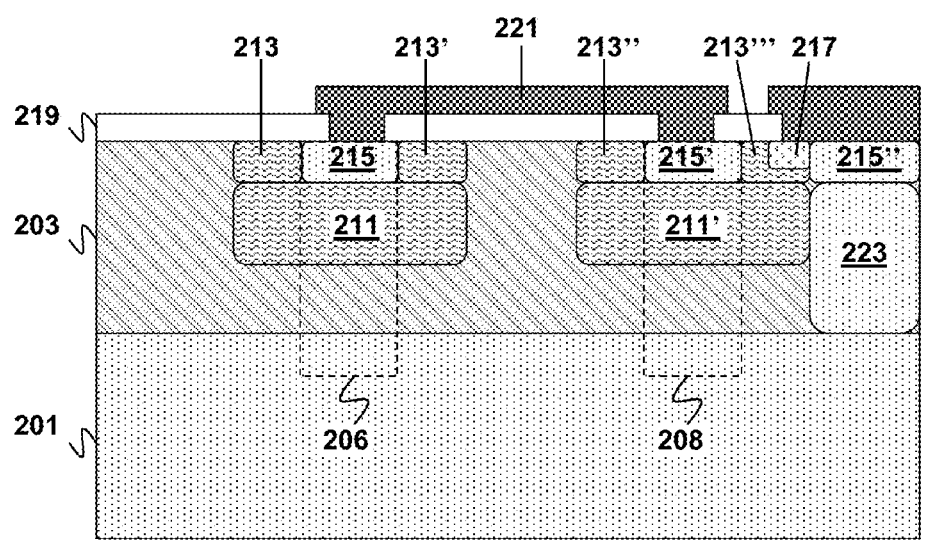
FIG. 2D is a cross-sectional schematic diagram illustrating a unidirectional transient voltage suppressor (TVS) device in accordance with another alternative embodiment of the present invention.

FIGS. 2B-2D illustrate alternative embodiments of the unidirectional transient voltage suppressor (TVS) device described above with respect to FIG. 2A. FIG. 2B is a cross-sectional schematic diagram illustrating a unidirectional transient voltage suppressor (TVS) device in accordance with an alternative embodiment of the present invention.

The unidirectional TVS 200' in FIG. 2B retains the same structure as the TVS 200 in FIG. 2A, except for the addition of an n+ sinker region 223. The n+ sinker region 223 is located within the epitaxial layer 203 directly below the third n+ source region 215" and directly above the interface between the n+ substrate 201 and the epitaxial layer 203. The n+ sinker 223 helps lower the resistance of the second NPN structure to the ground. The unidirectional TVS device 200' continues to operate and function as described above with respect to the circuit diagram in FIG. 1A.

FIG. 2C is a cross-sectional schematic diagram illustrating a unidirectional transient voltage suppressor (TVS) device in accordance with another alternative embodiment of the present invention. The TVS 200" in FIG. 2C retains the same structure as the TVS 200 in FIG. 2A except for the omission of the first and second isolation trenches 205, 205'. The isolation trenches 205, 205' in FIG. 2A serve the purpose of isolating the first NPN structure and second NPN structure from each other such that unwanted lateral PNP (i.e., first p-body region 211, epitaxial layer 203, and second p-body region 213) behavior does not occur during device operation. However, if the two p-body regions 211, 211' are spaced far enough apart, such lateral PNP behavior may be eliminated without having to introduce isolation trenches. By way of example, and not by way of limitation, the two p-body regions may be spaced approximately 10 microns apart. The unidirectional TVS device 200" continues to operate and function as described above with respect to the circuit diagram in FIG. 1A.

FIG. 2D is a cross-sectional schematic diagram illustrating a unidirectional transient voltage suppressor (TVS) device in accordance with another alternative embodiment of the present invention. The TVS 200''' in FIG. 2D retains the same structure as the TVS in 200' in FIG. 2B except for the omission of the first and second isolation trenches 205, 205' and the addition of an n+ sinker region 223. As discussed above with respect to FIG. 2C, the isolation trenches may be eliminated so long as the two p-body regions 211, 211' are spaced far enough apart such that no lateral PNP behavior occurs. Also, as discussed above, the addition of the n+ sinker region 223 helps lower the resistance of the second NPN structure to the ground. The unidirectional TVS device 200''' continues to operate and function as described above with respect to the circuit diagram in FIG. 1A.

FIGS. 3A-3I illustrate a method for forming the unidirectional TVS device depicted in FIG. 2A. While the diagrams and description will refer only to the TVS device depicted in FIG. 2A, one ordinarily skilled in the art will recognize that this fabrication method may be easily extended for any of the TVS devices described above by including or omitting standard processing steps.

Figure 3A:
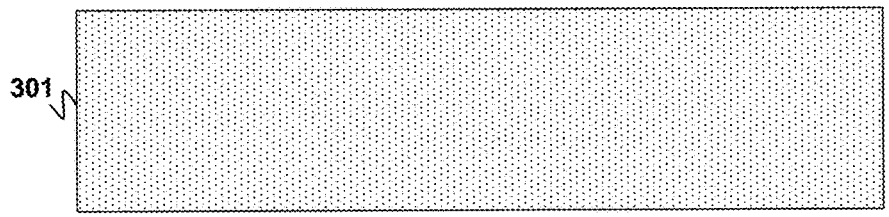
FIGS. 3A-3I illustrate a method for manufacturing a unidirectional transient voltage suppressor (TVS) device according to an embodiment of the present invention.
Figure 3B:
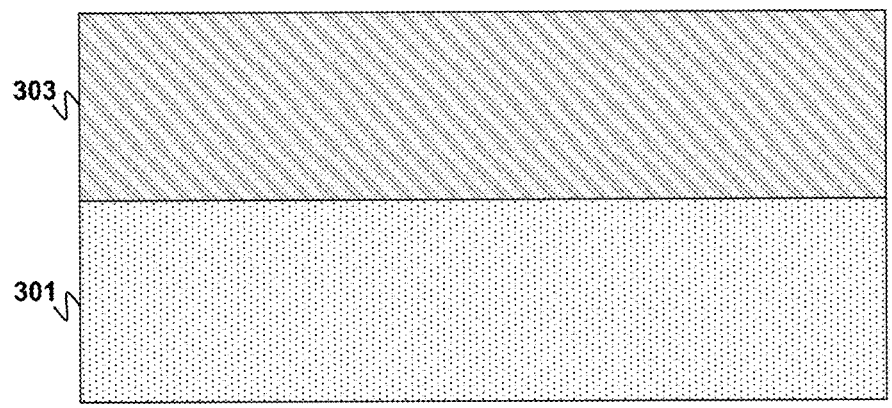

The unidirectional TVS device begins with an n+ type substrate 301 (e.g., silicon wafer) as illustrated in FIG. 3A. Using an n+ substrate 301 facilitates the formation of the two NPN structures that make up the unidirectional TVS device. An epitaxial layer 303 is then grown over the n+ substrate 301 as illustrated in FIG. 3B. The epitaxial layer 303 may be a lightly doped n− type epitaxial layer. The first epitaxial layer 303 and the n+ substrate 301 will collectively form the emitter of the two NPN structures.

Figure 3C:
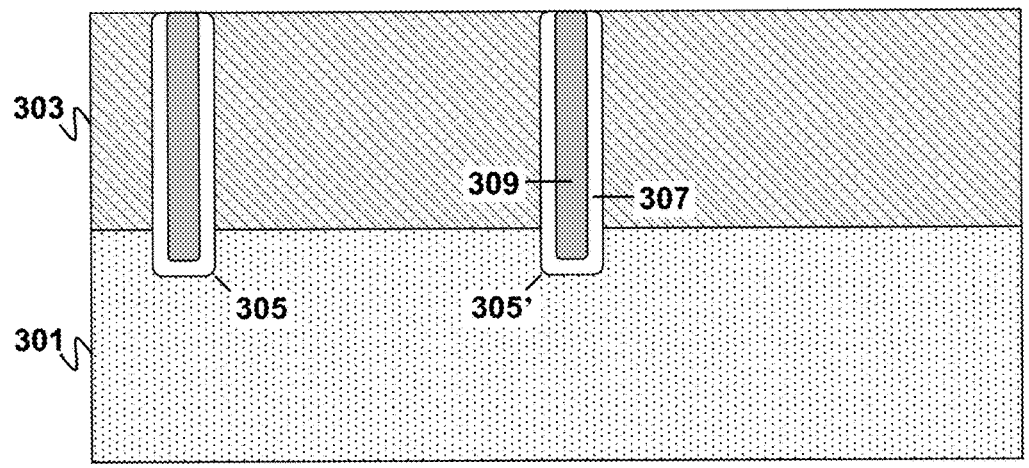

A first isolation trench 305 and a second isolation trench 305' are formed within the epitaxial layer 303 and the substrate 301 as illustrated in FIG. 3C. The isolation trenches 305, 305' may be etched using a hard mask (mask not shown) to a depth of approximately 5 microns such that the bottom of the trenches 305, 305' are located within the substrate 301. A layer of oxide 307 may then optionally be deposited or grown along the walls of the isolation trenches 305, 305' to a thickness of about 50 nm. Alternatively, the isolation trenches 305, 305' may be filled with oxide rather than polysilicon. The remainder of the isolation trenches 305, 305' may be filled with polysilicon 309. Any excess polysilicon 309 may be removed using an etch-back process. FIG. 3C shows the unidirectional TVS device after trenches have been etched and filled. The formation of isolation trenches 305, 305' is optional. As discussed above, if the two NPN structures are spaced far enough apart, any lateral PNP behavior may be eliminated.

Figure 3D:
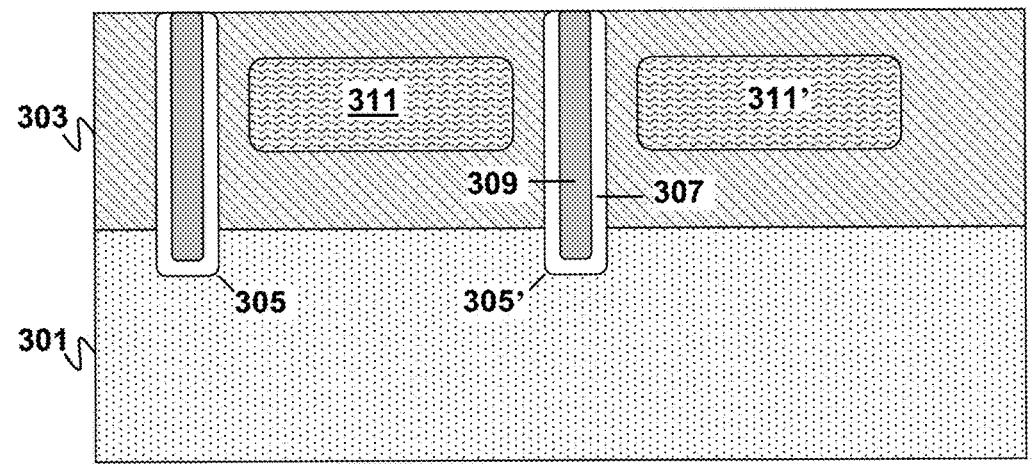

A masked implant (mask not shown) is subsequently performed to form a first p-body region 311 and a second p-body region 311' as illustrated in FIG. 3D. By way of example, and not by way of limitation, the implant may be followed by diffusion to achieve the desired doping concentration. The first p-body region 311 is formed within the epitaxial layer 303 between the first isolation trench 305 and the second isolation trench 305'. This first p-body region 311 will later serve as the body of the first NPN structure. The second p-body region 311' is formed within the epitaxial layer 303 to the right of the second isolation trench 305'. The second p-body region 311' will later serve as the body of the second NPN structure.

Figure 3E:
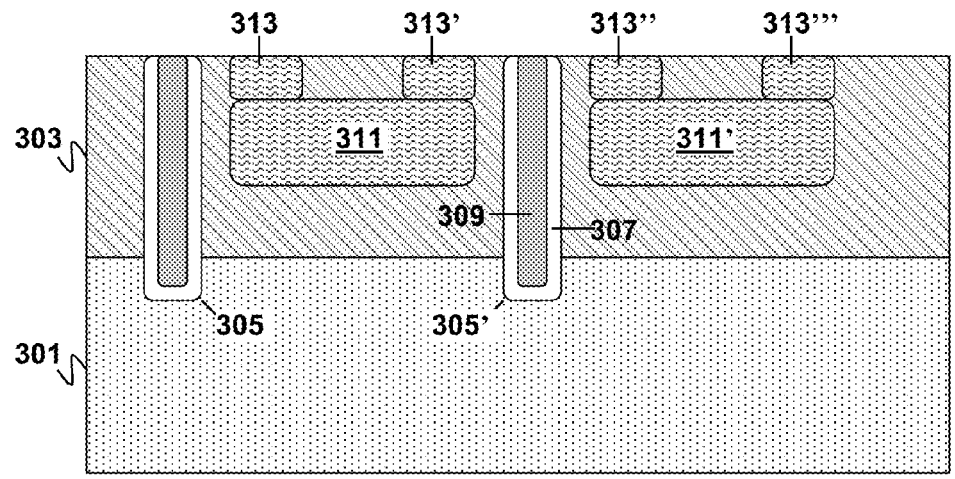

Another masked implant (mask not shown) is then performed to form a set of four p-trigger regions 313, 313', 313", 313''' as illustrated in FIG. 3E. By way of example, and not by way of limitation, the implant may be followed by diffusion to achieve the desired doping concentration. A first p-trigger region 313 is formed within a top surface of the epitaxial layer 303 directly above a left edge portion of the first p-body region 311. A second p-trigger region 313' is formed within a top surface of the epitaxial layer 303 directly above a right edge portion of the first p-body region 311. A third p-trigger region 313" is formed within a top surface of the epitaxial layer 303 directly above a left edge portion of the second p-body region 311'. A fourth p-trigger region 313''' is formed within a top surface of the epitaxial layer 303 directly above a right edge portion of the second p-body region 311'. The p-body trigger regions 313, 313', 313", 313''' allow for connections to be made to or to be made from the p-body regions 311, 311'.

Figure 3F:
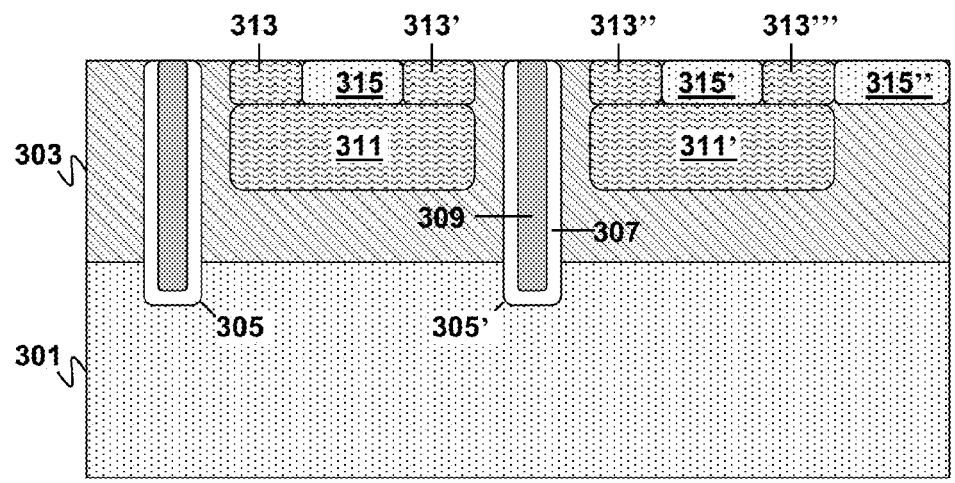

Another masked implant (mask not shown) is subsequently performed to form a set of three n+ source regions 315, 315', 315" as illustrated in FIG. 3F. By way of example, and not by way of limitation, the implant may be followed by diffusion to achieve the desired doping concentration. A first n+ source region 315 is formed within a top surface of the epitaxial layer 303 directly above the first p-body region 311 and situated between the first p-trigger region 313 and the second p-trigger region 313'. The first n+ source region 315 will later act as the collector of the first NPN structure. A second n+ source region 315' is formed within a top surface of the epitaxial layer 303 directly above the second p-body region 311' and situated between the third p-trigger region 313" and the fourth p-trigger region 313'''. The second n+ source region will later act as the collector of the second NPN structure. A third n+ source region 315" is formed within a top surface of the epitaxial layer 303 adjacent the right side of the fourth p-trigger region 313'''. The third n+ source region 315" will function to help facilitate short-circuiting the base (i.e., second p-body region 311') of the second NPN structure to the emitter (i.e., epitaxial layer 303 and n+ substrate 301) of the second NPN structure.

Figure 3G:
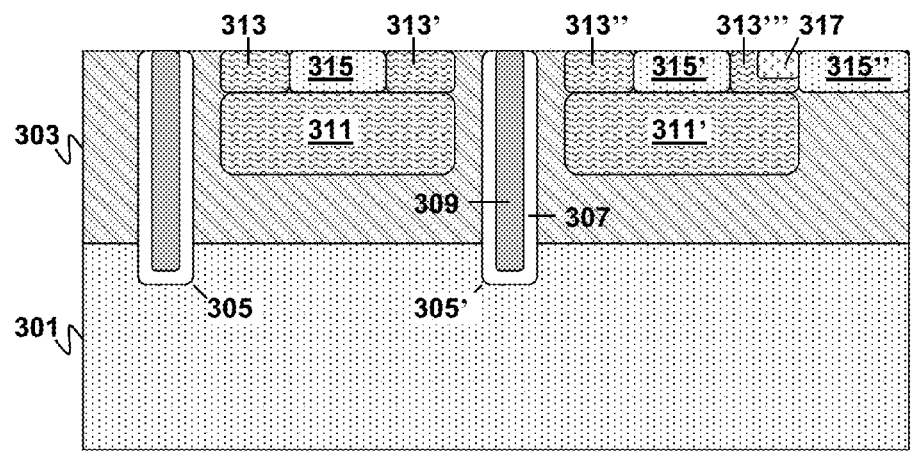

Another masked implant (mask not shown) is then performed to form a p+ implant region 317 as illustrated in FIG. 3G. By way of example, and not by way of limitation, the implant may be followed by diffusion to achieve the desired doping concentration. The p+ implant region 317 is formed within a top surface of the fourth p-trigger region 313''' adjacent a left side of the third n+ source region 315". The p+ implant region 317, along with the third n+ source region 315" will function to short-circuit the base (i.e., second p-body region 311') of the second NPN structure to the emitter (i.e., epitaxial layer 303 and n+ substrate 301) of the second NPN structure.

Figure 3H:
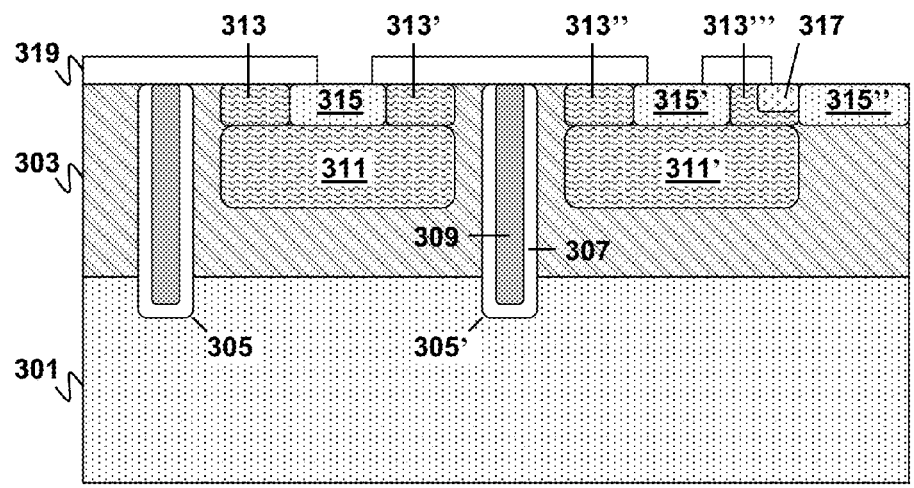

An insulating layer 319 (e.g., silicon oxide) may be optionally deposited on top of the epitaxial layer 319 as illustrated in FIG. 3H. Openings may be formed in the insulating layer 319 using conventional techniques in order to provide points of contact to the unidirectional TVS device. A first opening may be formed above the first n+ source region 315 in order to allow a contact to be made to the first NPN structure. A second opening may be formed above the second n+ source region 315' to allow a contact to be made to the second NPN structure. A third opening may be formed above the p+ implant region 317 and third source region 315" in order to allow for a contact to short the base of the second NPN structure to the emitter of the second NPN structure.

Figure 3I:
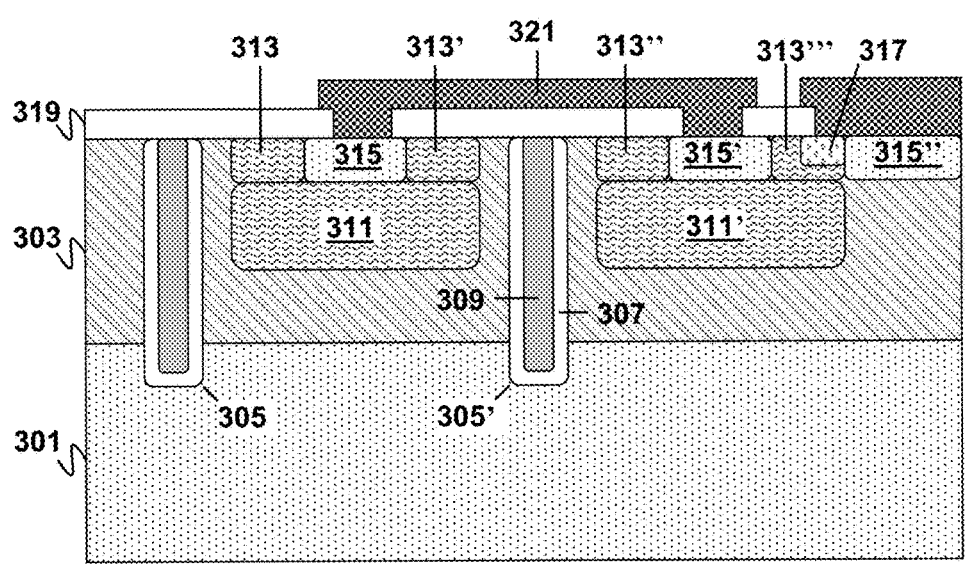

Lastly, metal pads 321 may be formed within the insulating layer 319 openings to provide electrical contacts/connections to the components of the unidirectional TVS device as illustrated in FIG. 3I. A metal pad 321 may be deposited over the first opening and the second opening allowing an electrical connection to make between the two NPN structures, and also to allow for an external source to make contact to both the first and the second NPN structures. Another metal pad 321 may be deposited over the opening above the p+ implant region 317 and the third n+ source region 315" to allow for the base of the second NPN structure to be short circuited to the emitter of the second NPN structure.

As discussed above, the steps recited above for fabrication of a unidirectional TVS device are limited to the unidirectional TVS device depicted in FIG. 2A, however additional process steps may be included or omitted in order to fabricate any of the other unidirectional TVS devices discussed above. For example, an additional masked implant may be used to form the n+ sinker region 223 of the unidirectional TVS devices depicted in FIGS. 2B and 2D. Another example involves omitting the steps for formation of isolation trenches in order to form the unidirectional TVS devices depicted in FIGS. 2C and 2D.

While the above is a complete description of the preferred embodiments of the present invention, it is possible to use various alternatives, modifications, and equivalents. Therefore, the scope of the present invention should be determined not with reference to the above description but should, instead be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112¶ 6

What is claimed is:

1. A method for manufacturing a unidirectional transient voltage suppressor (TVS) device, comprising:
   forming first and second NPN transistors that are connected in parallel to each other, wherein each of the first and second NPN transistors includes a collector region, an emitter and a base, wherein the first and second NPN structures are formed on a common substrate by forming an epitaxial layer of a first conductivity type on top of a substrate of the first conductivity type, wherein the first NPN transistor has a floating base;
   forming a first body region and a second body region of a second conductivity type opposite to the first conductivity type within the epitaxial layer, wherein the first body region is located between a first and second isolation trenches and the second isolation trench is located between the first body region and the second body region, wherein the first and second isolation trenches are extended below an interface between the substrate and the epitaxial layer, and
   shorting the base of the second NPN transistor to the emitter of the second NPN transistor.

2. The method of claim 1, wherein forming the first and second NPN transistors includes forming the common substrate; and wherein portions of the semiconductor substrate and epitaxial layer are the emitters for the first and second NPN structures.

3. The method of claim 2, wherein forming the first body region and second body region in b) involves:
   applying a mask to a surface of the epitaxial layer; and
   performing ion implantation followed by diffusion.

4. The method of claim 1, further comprising forming wherein the first and second isolation trenches are formed prior to forming the first and second body regions.

5. The method of claim 4, wherein forming the isolation trenches involves:
   applying mask to a surface of the epitaxial layer; and
   etching the epitaxial layer through the mask.

6. The method of claim 4, further comprising filling each of the isolation trenches with dielectric material.

7. The method of claim 4, further comprising lining each of the isolation trenches with a dielectric material and filling a remaining portion of the trench not occupied by the dielectric material with polysilicon.

8. The method of claim 1, wherein forming the first and second NPN structures includes:
   forming a set of trigger regions of the second conductivity type within a surface of the epitaxial layer; and
   forming a set of source regions of the first conductivity type within a surface of the epitaxial layer, the trigger regions and source regions including a first source region that provides a collector for the first NPN transistor located transversely adjacent the first body region between first and second trigger regions that are laterally adjacent the first source region and transversely adjacent the first body region, a second source region that provides a collector for the second NPN transistor located transversely adjacent the second body region between third and fourth trigger regions that are laterally adjacent the second source region and transversely adjacent the second body region, and a third source region located laterally adjacent the fourth trigger region, wherein the fourth trigger region is between the second and third source regions.

9. The method of claim 8, wherein shorting the base of the second NPN transistor to the emitter of the second NPN transistor includes forming an implant region of the second conductivity type within the fourth trigger region, the implant region being laterally adjacent the third source region.

10. The method of claim 9, wherein forming the implant region in e) involves:
    applying a mask to a surface of the epitaxial layer; and
    performing ion implantation followed by diffusion.

11. The method of claim 8, wherein forming the set of four trigger regions involves:
    applying a mask to a surface of the epitaxial layer; and
    performing ion implantation followed by diffusion.

12. The method of claim 8, wherein forming the set of three source regions
    applying a mask to a surface of the epitaxial layer; and
    performing ion implantation followed by diffusion.

13. The method of claim 8, further comprising forming a sinker region of the first conductivity type, wherein the sinker extends transversely between the third source region and the substrate.

14. The method of claim 8, further comprising forming an isolation layer on the epitaxial layer, wherein the epitaxial layer is between the isolation layer and the substrate, the isolation layer having a first opening transversely adjacent the first source region, a second opening transversely adjacent the second source region, and a third opening transversely adjacent the implant layer and the third source region.

15. The method of claim 14, further comprising forming a first metal contact formed in the first opening and the second opening of the isolation layer and forming a second metal contact in the third opening of the isolation layer.

* * * * *